United States Patent [19]
White

[11] Patent Number: 5,996,004
[45] Date of Patent: Nov. 30, 1999

[54] CONCURRENT PROGRAMMING APPARATUS AND METHOD FOR ELECTRONIC DEVICES

[75] Inventor: William H. White, Houston, Tex.

[73] Assignee: BP Microsystems, Inc., Houston, Tex.

[21] Appl. No.: 08/581,767

[22] Filed: Jan. 2, 1996

[51] Int. Cl.⁶ .................................................. G06F 13/00
[52] U.S. Cl. ......................................... 709/217; 709/220
[58] Field of Search ........................... 395/200; 340/825; 709/216–229, 249–257; 710/8–13

[56] References Cited

U.S. PATENT DOCUMENTS

| | | | |
|---|---|---|---|
| 4,829,297 | 5/1989 | Ilg et al. | 340/825.08 |
| 4,876,664 | 10/1989 | Bittorf et al. | 364/131 |
| 5,056,001 | 10/1991 | Sexton | 364/260 |
| 5,162,986 | 11/1992 | Graber et al. | 364/146 |
| 5,225,975 | 7/1993 | Gates et al. | 364/147 |
| 5,371,692 | 12/1994 | Draeger et al. | 364/580 |
| 5,426,421 | 6/1995 | Gray | 340/825.15 |
| 5,428,526 | 6/1995 | Flood et al. | 364/141 |

OTHER PUBLICATIONS

ProMaster 9500 Automated Handling System for Fine–Pitch Programmable Devices, Data I/0 Corporation, 1995.
Universal Device Programmer, BP–1200, BP Microsystems, 1994.
3910 Flexible Programming System, Data I/O Corporation, 1994.
ProMaster 7000 Integrated Production Programming System, Data I/O Corporation, 1992.
PSX1000 Parallel Programmer, Data I/O Corporation, 1992.
UniSite Universal Programmer, Data I/O Corporation, 1991.
XPRO–1, Stand Alone Intelligent EPROM/FGPA Programmer, pp. 12–15.

*Primary Examiner*—Christopher B. Shin
*Attorney, Agent, or Firm*—Townsend and Townsend and Crew LLP

[57] ABSTRACT

A computer controlled group of programmer sites are provided to burn in or enter operating code into various types of programmable electronic devices, such as programmable memories, programmable logic devices (or PLD's), field programmable gate arrays (or FPGA's), and the like. The programmer sites are connected to a central controller and operate under control of the central controller, typically personal computer. Each programmer site includes its own computer processor or CPU. Initially for a production run of a particular type of device, one of the programmer sites serves as a master site. At the master site, an optimized control sequence for the device is developed in conjunction with the central controller. Once this is achieved, the optimal sequence is broadcast to all programmer sites connected to the central controller. Thereafter, each programmer site, including the former master site, operates autonomously to program the devices independently of the status of the other sites, while the central computer scans each of the network sites in a timed sequence and provides monitoring and reporting functions.

46 Claims, 6 Drawing Sheets

CONCURRENT PROGRAMMING APPARATUS AND METHOD FOR ELECTRONIC DEVICES

BACKGROUND OF INVENTION

1. Field of Invention

The present invention relates to automated transfer or programming of operating codes and data into programmable electronic devices.

2. Description of Prior Art

In the semiconductor industry, a considerable number of electronic devices are provided by vendors in programmable form with blank memories or unspecified connections between arrays of logic circuits. Users can then custom configure or program the electronic devices to perform their intended functions by programming them, transferring or "burning in" a sequence of operating codes into the memory, or by specifying a particular arrangement of gating logic connections.

Special purpose programming machines, known as device programmers, have been developed to allow designers and engineers to rapidly transfer these codes, gating logic arrangements and the like into the programmable devices. The initial type of device programmer was a stand alone or single device programmer, allowing an operator to insert and program individual devices according to end user requirements. The programming pattern for the device was transferred into the device from a device programming computer or logic circuit.

The more recent type of device programmers developed were known as gang programmers. These were intended for large production runs of the same type or model of programmable device. An array of device programming sites like the single site station ones operated in parallel in a common programming sequence according to production programming codes from a single central computer. A set or production run group of devices would be loaded into the array of programming sites. When the sites were loaded, the array of devices was then programmed in a common, ganged sequence, each device starting and completing the programming sequence in common with each of the other devices.

There were, however, several undesirable features to gang programming. One of these was time inefficiency. When the programming machine was being loaded with blank devices by the operator, none of the programming sites was operating due to the required common starting and operating sequence. Further, once the programming machine was loaded and started into the programming run, the machine operator was idle until the gang programming sequence was completed.

Also, it was difficult to monitor the status or progress of the programming. If a machine operator was distracted or interrupted when loading or unloading an array of programming sites, it was very difficult without repeating the programming cycle to determine whether the devices were either beginning blank ones or completed programmed devices because the gang programmer or conventional programmer's status indicator continues to indicate that the last device programmed in each site was successfully programmed even after the successfully programmed device was removed and a blank device was inserted into the programming site. Additionally, a number of types of semiconductor devices, due to increasing productivity requirements, might have slightly, but not inconsequentially, different operating parameters or characteristics. An example would be the programming voltage level. These variations might even occur among devices in the same production run from the semiconductor manufacturer. Nevertheless, gang programming might be attempted of a number of such devices based on an assumed existence of common parameters. If there were in fact variations in the operating parameters, even if minor ones, gang programming could result in flawed or defective production of programmed devices because the gang programmer applies similar waveform voltages and pulse widths to each of the devices being programmed in the set.

One disadvantage of gang programmers was software complexity. The software had to be written such that it can apply waveforms to all devices simultaneously and verify that each programmed device verifies correctly. As programming algorithms increased in complexity to handle more complex devices, the difficulty in writing such software increased disproportionately.

The only available option for many users was to operate a number of conventional single-site programmers side by side. Doing so allowed increased operator efficiency, but also some disadvantages. First, each site was a separate and complete programmer, thus duplicating the user interface and the algorithm storage requirements, thereby increasing cost and complexity. Second, each system was configured by the user independently, thus taking time and allowing simple operator error to cause quality problems. Third, each system's status was reported separately, so status of the total operation was indeterminable except by manual methods. Finally, if a new algorithm was required to program a particular type of device, each station was required to be loaded with the new algorithm.

SUMMARY OF INVENTION

Briefly, the present invention provides a new and improved apparatus and method for programming a plurality of electronic devices. A control computer and a suitable number of programming sites, each of which includes its own computer, are connected together. One of the programming sites serves as a master site during initial set up for a programming run of a group of electronic devices. The control computer and the master site initially determine the programming sequence for the group of electronic devices. Thereafter, the control computer broadcasts the determined operating sequence to all the programming sites. The sites then operate independently of one another, each being adapted to receive and transfer code to a device without regard to the operating status of the other sites. The control computer polls the sites in a time sequence to provide monitoring and reporting functions at a common display.

The programming sites according to the present invention also include status detection circuitry to detect the status of transfer of the code into the device. For example, the status detectors at each site sense if the device is either ready to begin or is in progress for transfer of the operating code. After the transfer cycle is complete, the status detector senses and causes an indicator to indicate whether a particular device has satisfactorily completed receipt of the code or whether the code transfer was faulty. If the device is removed, status changes again. For example, after a successfully programmed device is removed, the pass indicator is turned off thereby eliminating the possibility that a blank device will be interpreted as programmed.

DESCRIPTION OF DRAWINGS

A better understanding of the present invention can be obtained when the following detailed description of the preferred embodiment is considered in conjunction with the following drawings, in which.

DESCRIPTION OF THE PREFERRED EMBODIMENT

Figure 1:
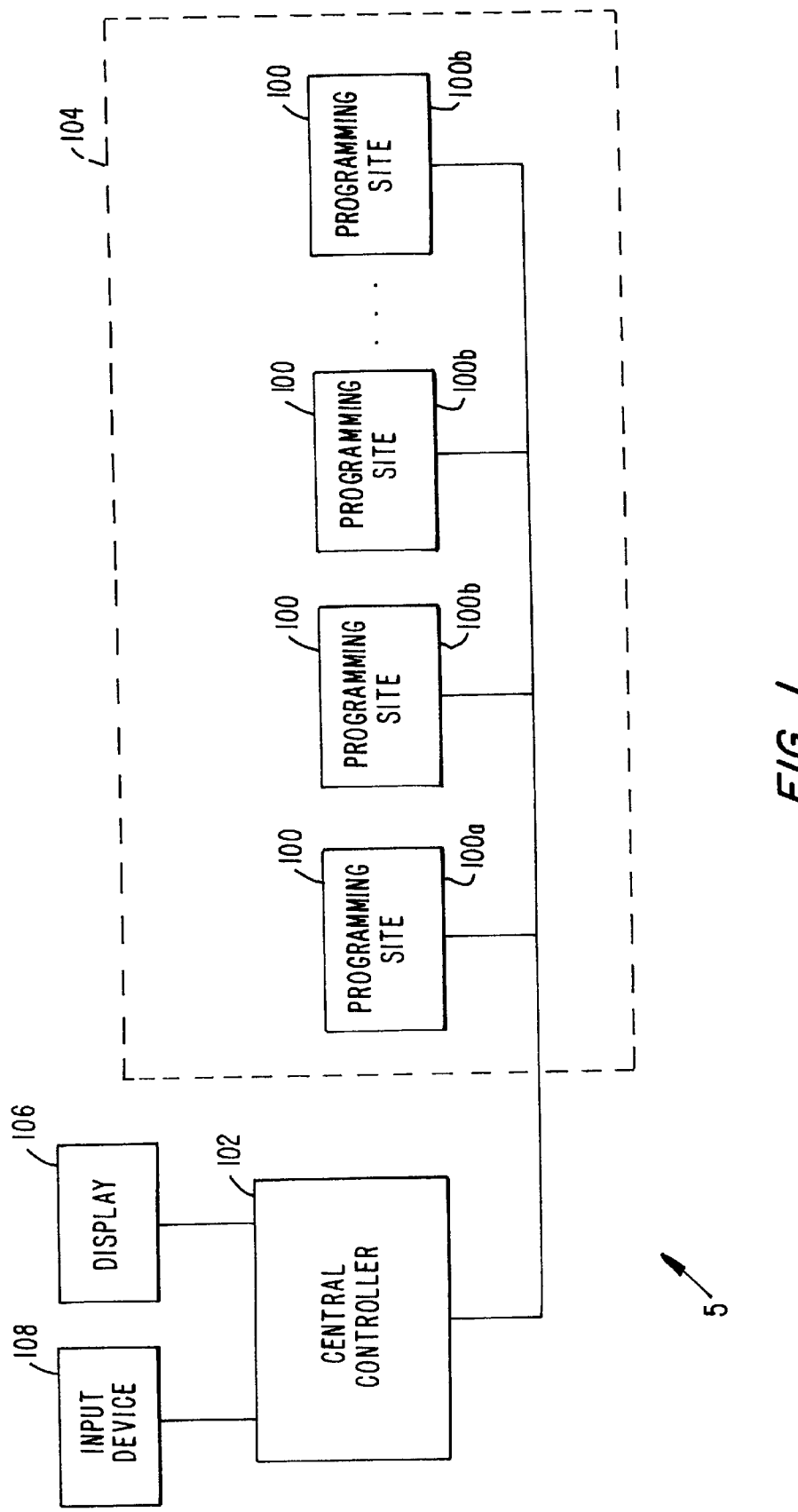
FIG. 1 is a block diagram illustrating a concurrent programming system according to the preferred embodiment of the present invention.

Referring now to FIG. 1, there is illustrated a concurrent programming system S according to the preferred embodiment. The concurrent programming system S comprises a plurality of programming sites 100 each connected to a central controller 102. The programming sites 100 are independent but conveniently grouped together into a single unit, called a programming station 104 for operation by a single user. A number of programming stations 104 can be connected to the central controller 102 if further capacity is desired, with each programming station 104 operable by single or multiple users.

The central controller 102 is conveniently a conventional International Business Machines (IBM) compatible personal computer (PC) including a display 106 and input device 108 for accepting input from a user and providing visual and optional audio status. Alternatively, other standard or proprietary computers capable of remote communications and user interaction may be used. The PC is preferred since it is widely available and provides a standard platform for software to operate.

It is contemplated that the central controller 102 could alternatively be integrated as part of the programming station 104, in which case smaller forms of the input device 108 and display 106 would be used, such as a liquid crystal display (LCD) and keypad. The central controller 102 connects to the programming sites 100 via a bidirectional parallel port, although any serial or parallel communications scheme is adequate. In an alternative embodiment, the programming stations 104 are connected to a conventional computer network, such as Ethernet or Token Ring, with each programming site 100 being a network node.

Each programming site 100 includes identical logic and features, which are more fully described below. Each programming site is capable of programming a variety of programmable devices, such as Programmable Logic Devices (PLDs), Programmable Array Logic (PAL®) devices, Programmable Read-Only Memories (PROMs, OTP PROMs, EPROMs, EEPROMs, FLASH memories, etc.), Field Programmable Gate Arrays (FPGAs), programmable microcontrollers and other devices containing a programmable element. All types of package types are supported by an interchangeable receptacle (discussed below).

One of the programming sites 100 is identified as a master site 100a, with the remaining programming sites 100 serving as slave sites 100b. The master site 100a works in concert with the central controller 102 to develop an optimal control sequence for a programmable device. Once the optimal control sequence is developed, the central controller 102 downloads the sequence into each of the individual programming sites 100. From then on, the programming sites 100 operate independently and concurrently to program individual programmable devices of the same type without intervention from the central controller 102 except to report status back to the central controller 102 and to restart the programming operation. It is contemplated that the programming station 104 could be initialized to concurrently program different device types, but this is not preferable from a practical standpoint since multiple devices types may cause operator confusion or at least reduced performance and thereby reduce the benefits of the present invention.

In the alternative embodiment described above wherein the central controller 102 is integrated within the programming station 104, a further alternative is contemplated wherein the master site provides the functionality of the central controller, thereby reducing the number of processing elements by one.

Thus, once programming begins at the individual sites, it is not necessary to wait for all programming sites 100 to finish programming before unloading the programmed devices. One programming site 100 can be programming while an operator is removing or inserting a device in another programming site 100. This is particularly important for complex devices such as an Altera 7128 where the programming time is up to 36 seconds. Prior art programmers were limited to about 88 devices per hour. By providing multiple independent programming sites throughput can be increased to about 700 devices per hour. Furthermore, fault tolerance is increased significantly and the independent programming sites allow each site to fine tune particular programming parameters according to the inserted device without affecting the other sites, thereby increasing yields.

Figure 2:
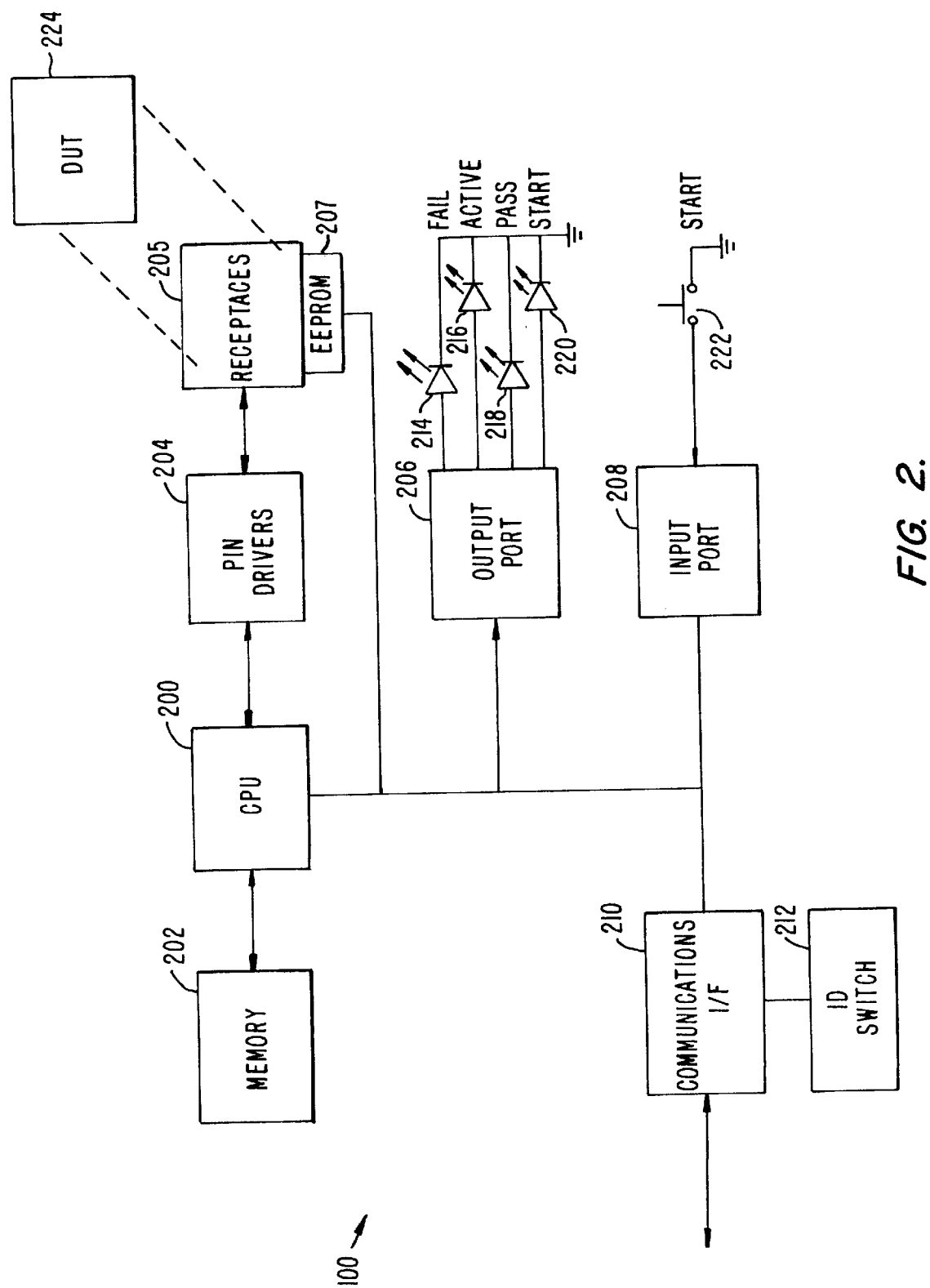
FIG. 2 is a block diagram illustrating a device programming site of the concurrent programming system of FIG. 1 according to the preferred embodiment.

Now referring to FIG. 2 there is illustrated a block diagram of a programming site 100 according to the preferred embodiment. A central processing unit (CPU) 200 couples to memory 202, a pin driver circuit 204, an output port 206, an input port 208 and a communications interface 210. The communications interface 210 includes a user configurable identification switch 212, or equivalent mechanism, for the central controller 102 to uniquely identify each programming site 100. It is noted that other software or hardware methods or means of identifying a single site are adequate to accomplishing the present invention. Communications between the central controller and the programming site 100 are handled through the communications interface 210. The programming site 100 receives the control sequence from the central controller 102 and stores it in memory 202. Because the downloaded control sequence is identical for each programming site 100, a shared memory or direct memory access (DMA) architecture may be used in an alternative embodiment wherein each programming site 100 includes a CPU 200. Each such CPU would communicate with the shared memory module, thereby reducing costs at the expense of a slightly more complex design. Shared memory architectures are known in the computer arts and therefore are not discussed further herein.

The pin drivers 204 are coupled to an interchangeable receptacle or socket 205 for applying voltages and waveforms to a device under test (DUT) 224 received into the receptacle 205. The DUT 224 is the programmable device currently being operated on by the programming site 100. The receptacle 205 typically supports only one device at a time, but certain receptacles can support multiple devices at a time. The receptacle 205 also includes a memory 207 for storing a count of device operations. The memory 207, preferably an electrically erasable programmable memory (EEPROM), couples to the CPU 200. The CPU 200 executes the control sequence, thereby causing the pin drivers 204 to develop appropriate voltages and waveforms on appropriate pins of the DUT according to the device manufacturer's specifications of the DUT.

In addition to reporting status to the central controller 102, the site 100 provides a visual indication of the status of the DUT. The output port 206 provides signals to a series of status indicator LEDs including a fail LED 214, an active LED 216, a pass LED 218, and a start LED 220. The CPU 200 writes certain values into a register of the output port 206 thereby causing the LEDs to turn on or off. The start LED 220 is integral with a start switch 222 which is coupled to the input port 208. The CPU 200 polls the input port 208 to determine whether the start switch 222 is depressed. Alternative embodiments are contemplated wherein the status display mechanism and start switch may take another form (such as an LCD or switch attached to the receptacle 205) or absent altogether.

Figure 3A:
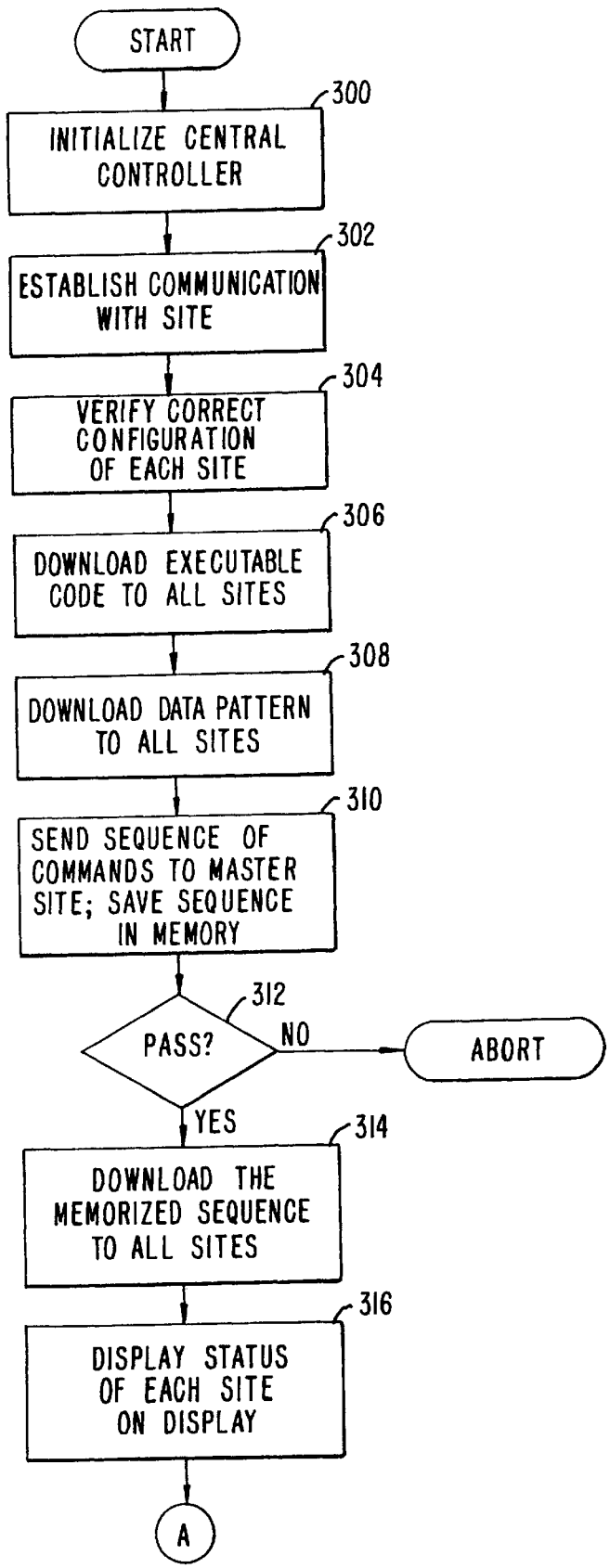
FIGS. 3A and 3B are flow diagrams illustrating an operating sequence for the system of FIG. 1 according to the preferred embodiment.
Figure 3B:
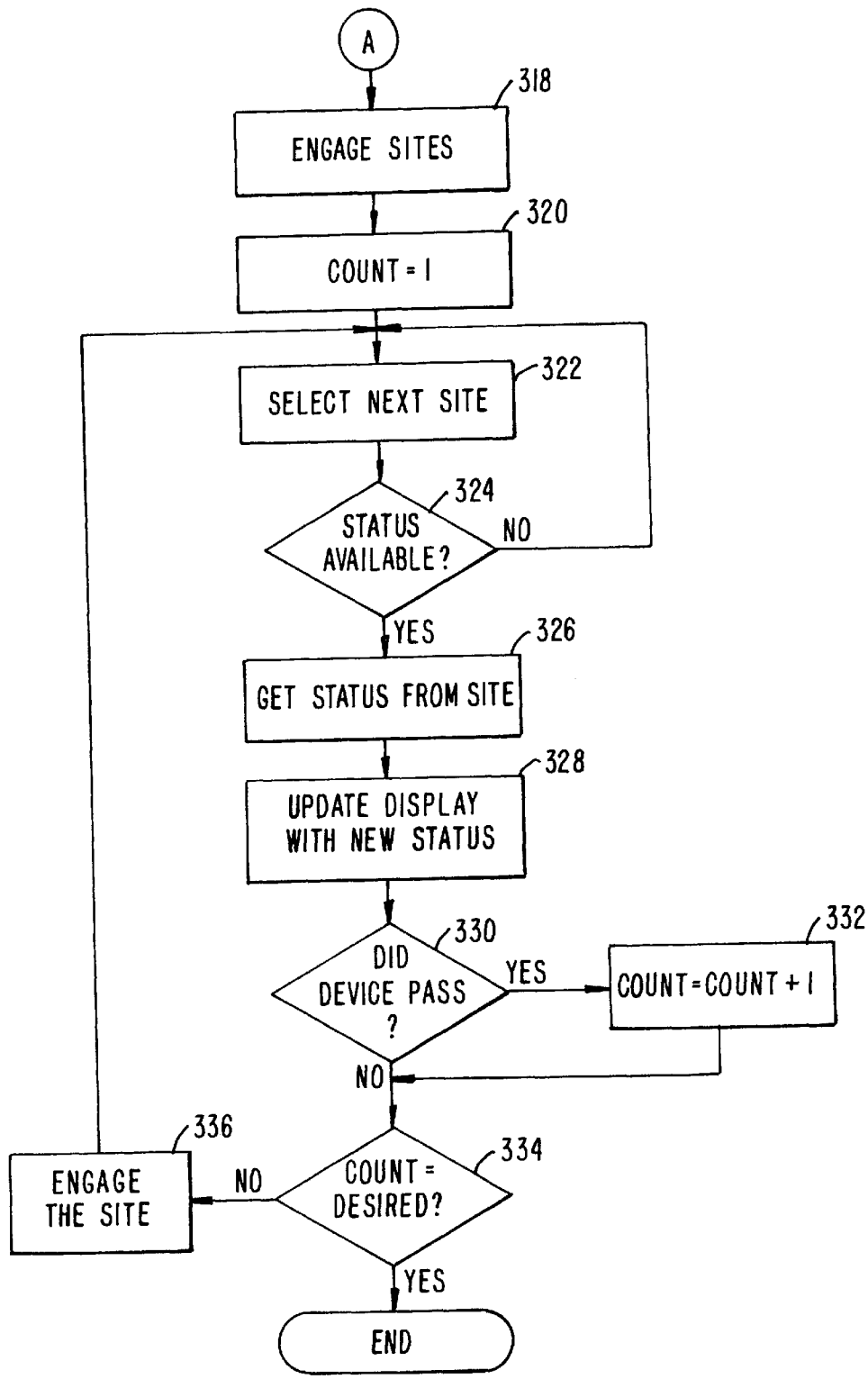

Now referring to FIGS. 3A and 3B, there is illustrated a sequence of steps performed by the central controller 102 in initializing the programming station 104. The sequence starts at step 300 where the central controller 102 is initialized by the user. Initialization includes such operations as selecting the device type; selecting a data pattern to be programmed into the programmable devices and loading it into a buffer of the central controller 102; selecting a number of operations to be performed; and selecting various other options including word range, offset, data path width, blank checking, verification after programming, continuity testing, autostart, check electronic ID, run vector tests, and security programming. The autostart option causes the site to begin the programming operation once it detects the device has been inserted. The detection is performed by a device continuity test whereby current is applied to the device pins to determine if the device is inserted correctly. An alternative embodiment is contemplated wherein a sensor or switch on the receptacle 205 determines when the device is secured into the receptacle.

At step 302, the central controller 102 attempts to establish communications with each of the programming sites 100. If a particular site is not responding then the central controller 102 relays that information to the user and allows the operation to proceed on the sites that respond correctly. At step 304, the central controller 102 checks each programming site 100 for the correct configuration. This includes checking for the proper receptacle 205 and whether it is installed correctly. If the proper receptacle 205 is attached, a count of successful device operations is read from memory 207 located on the receptacle 205 and compared against a recommended maximum number of device operations. If this number is exceeded, the user is notified and given the option to replace or remove the receptacle or disregard the message. The central controller 102 proceeds to download executable code to each of the programming sites 100, at step 306. This code is comprised of the sequence of instructions necessary to perform the operations selected by the user. After the executable code is downloaded, at step 308, if necessary the central controller 102 downloads the data pattern to be programmed into the selected devices to each of the programming sites 100. At step 310, the Ventral controller 102 communicates a sequence of commands to the master site 100a. This sequence of commands is performed by the master site 100a according to the previously downloaded executable code and data. As the master site 100a is performing the commands, the central controller 102 memorizes or stores the sequence in its memory. It is desirable that only necessary steps are memorized, thereby providing a more efficient or optimized sequence of steps for the sites 100 to subsequently execute. The optimation is performed by the central controller. It is common for the optimization to eliminate the transfer of redundant or unused data, address sequences and/or code. For example, in order to program many PLDs, it is not necessary to address bits that are not to be programmed. It is also not necessary to apply programming pulses to data bits that represent an unprogrammed bit of the device. Certain operations included into the executable code stream, but not commanded to be performed, are also left out of the memorized sequence as unnecessary. For example, once the bits to be programmed in the DUT 224 have been determined for the first device, it is not necessary to read the original pattern data again when programming subsequent devices. By performing these optimizations initially while programming the first device, the subsequent high volume operations perform much more rapidly on the individual sites 100.

Also, in certain cases, steps 306–310 are performed interactively and not necessarily in the same order. For example, after the executable code is downloaded, a power-on command to power on the device may be provided to the CPU 200 before the data is actually provided. Steps 306–310 cause the master site CPU 200 to perform steps 400–418.

After the commands have been performed, the status of the operation is determined, at step 312. If the operation fails, the central controller 102 aborts further operations until the operator can determine the cause of the error. If the operation passes, the central controller 102 proceeds to step 314. Both the central controller 102 and the master site 100a perform tests to determine success. At step 314, the central controller 102 downloads the memorized sequence to each of the programming sites 100. The status of each of the programming sites 100 is then displayed on the display 106, at step 316.

The use of the master site 100a provides an efficient mechanism for early detection of an improper setup. Hence, setup changes can be performed by the operator before the remaining slave sites 100b are initialized. Of course, the steps utilizing the master site 100a mechanism could be eliminated (particularly steps 310 and 312) and more conventional methods used, whereby the code is delivered to each site 100. However, this is not preferable since it does not provide the operator an early indication of impending failure. Furthermore, the code of the central controller 102 to optimize the sequence of instructions is more complicated.

The central controller 102 then enables each of the programming sites 100 for independent operation, step 318, thereby causing each site to execute steps 400–418. The central controller 102 then initializes its device counter to one (1), at step 320. The central controller 102 then enters a polling routine where, at step 322, a programming site 100 is selected. Next, at steps 324 and 326, the central controller 102 polls or checks the status of the selected programming site 100. If status is not available, control loops back to step 322 to select another site. If the site status is indicated available, at step 326, the status is read from the programming site 100 and at step 328 the display 106 is updated with the new status. It is contemplated that such polling can be alternatively performed with interrupt routines.

At step 330, the central controller determines if the status provided by the selected programming site 100 indicates the device passed. If so, at step 332 the count is incremented by a count of one (1). If not, control proceeds to step 334 where the central controller determines if the desired number of devices has been programmed. If not, control proceeds to step 336 to restart the site 100, then back to step 322 where a next programming site is selected in a round robin or sequential fashion and the polling routine continues. If at step 334 it was determined that the desired number of devices has been programmed, then the operation is deemed complete.

Figure 4:
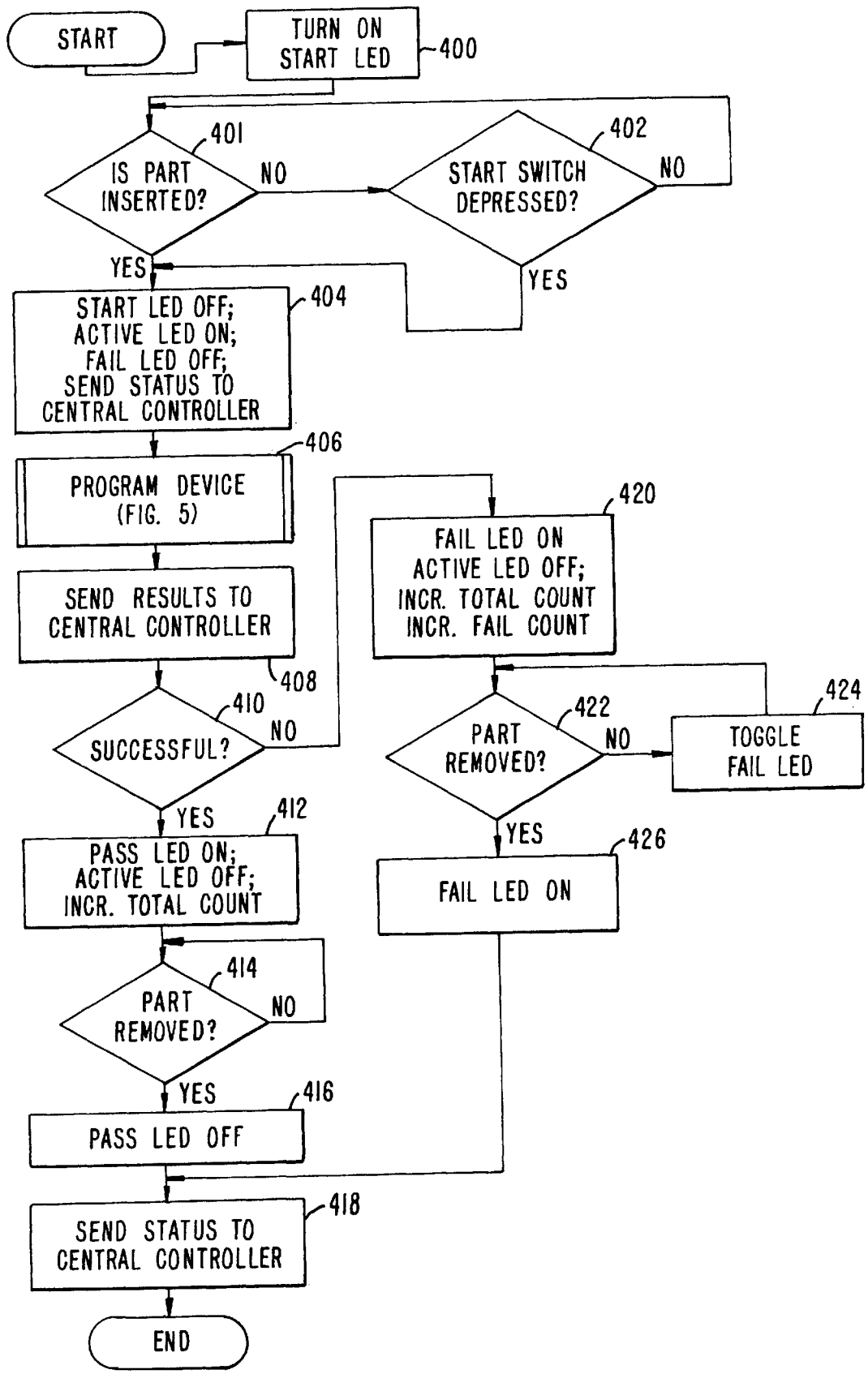
FIG. 4 is a flow diagram illustrating the operating sequence for the device programming site of the type illustrated in FIG. 2 according to the preferred embodiment.

Now referring to FIG. 4, there is illustrated a sequence of steps performed by the CPU 200 of each programming site 100 in the programming of devices. It is noted that each of the programming sites 100 is capable or performing this sequence of steps independently and concurrently with the other sites. It is also noted that certain steps could be performed by either the CPU 200 or the central controller 102. The sequence starts upon engagement by the central controller 102, such as at step 318. At step 400, the start LED 220 is turned on. At step 401, the programming site 100 determines whether a device, such as the DUT 224, is inserted into the receptacle 205. If not so, then control proceeds to step 402 where it is determined if the start switch 222 is depressed. If the start switch is not depressed, then control proceeds back to step 401. If either the part is inserted, at step 401, or the start switch is depressed, at step 402, control proceeds to step 404 where the active LED 216 is turned on, the fail LED 214 and start LED 220 are turned off and status is provided to the central controller 102. At step 406, the device is programmed according to the downloaded sequence of instructions and particular device characteristics. More detail on this operation is provided below in conjunction with the description of the procedures set forth in FIG. 5.

Control then proceeds to step 408 where the results of step 406 are passed to the central controller 102. At step 410, the CPU 200 begins updating the status of the LEDs 214–220 by determining whether the operation was successful. If so, then control proceeds to step 412 where the pass LED 218 is turned on and the active LED 216 is turned off The count of total operations performed by this receptacle 205 is recorded in the EEPROM memory 207 located on the receptacle. Control then proceeds to step 414 where the CPU 200 determines whether the device has been removed. Step 414 is repeated until the device is removed, upon which control proceeds to step 416 where the pass LED 218 is turned off.

If at step 410 it is determined that the operation was not successful, control proceeds to step 420 where the fail LED 214 is turned on and the active LED 216 is turned off, thereby indicating to the user that the programming operation failed and the device may be removed. The count of total operations and failed operations on this receptacle 205 is recorded in the EEPROM memory 207 located on the receptacle. The CPU 200 then determines whether the device has been removed. If the device has not been removed, then at step 424 the CPU 200 causes the fail LED 214 to toggle, thereby providing a visual indication to the user that the programming operation failed, but was attempted. If the device is removed, then the CPU 200, at step 426 causes the fail LED 214 to remain on until a new device is inserted. Thus, if the operator forgets to immediately look at the status indication, the failure indication is held until a new part is inserted. Furthermore, the operator is provided multiple indications to prevent blank or failed devices from being misinterpreted as programmed.

Steps 416 and 426 both proceed to step 418 where the CPU 200 causes status of the above operation to be sent the central controller 102. The display 106 provides an indication of the current and ongoing operations. The status of each site is displayed on the display. Furthermore, the status of the operation as a whole is determined and displayed, including such statistics as the number of devices passed, failed and remaining to be programmed, as well as the number of devices programmed per hour. The CPU 200 then waits idle for another engage command from the central controller 102.

Figure 5:
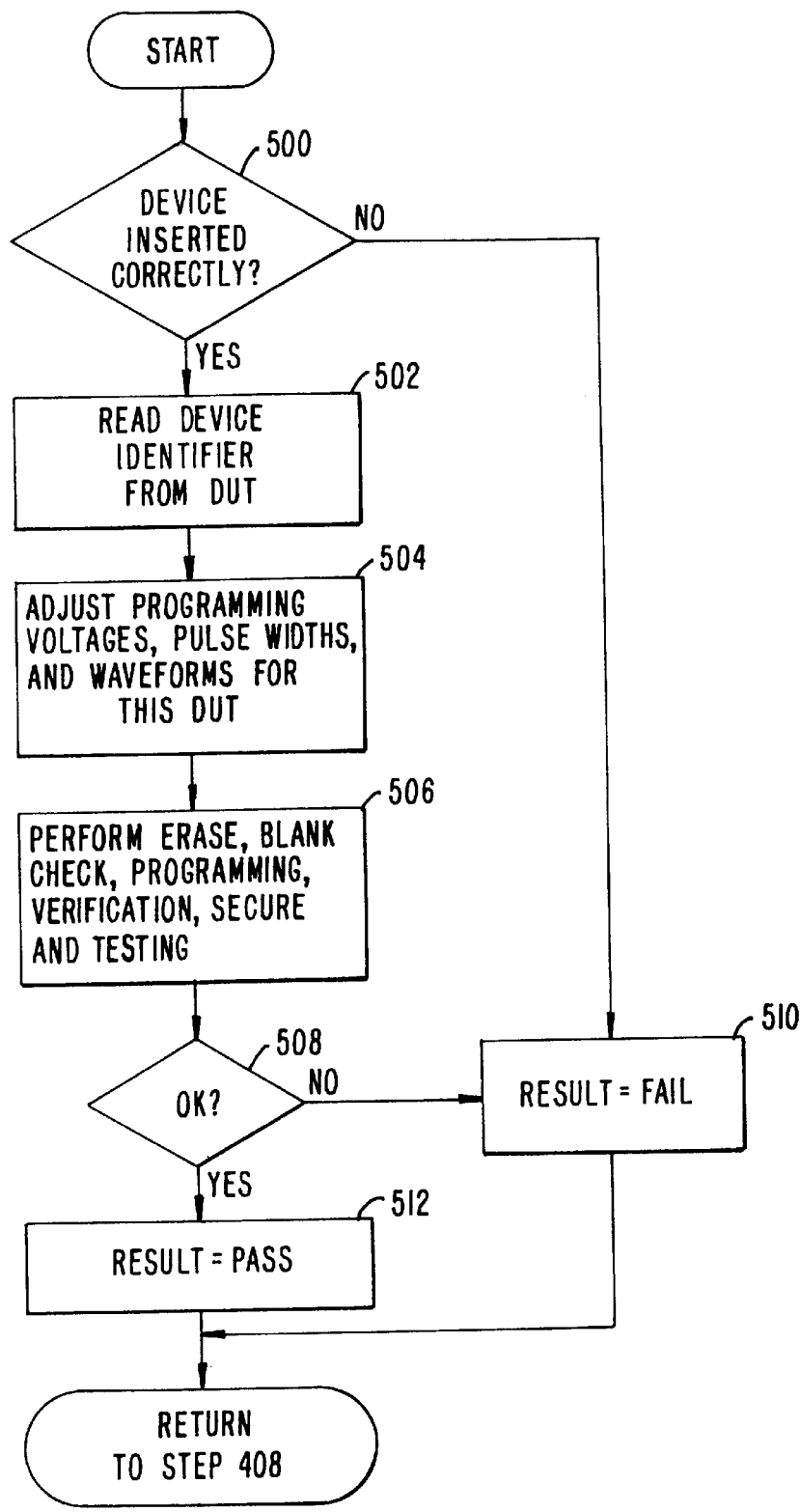
FIG. 5 is a flow diagram illustrating in more detail a portion of the operating sequence of FIG. 4 according to the preferred embodiment.

Now referring to FIG. 5, there is illustrated a sequence of steps performed by the CPU 200 to accomplish the programming step 406 of FIG. 4. At step 500, the CPU 200 determines whether the device is inserted into the receptacle 205 correctly. If not so, the device cannot be programmed and the CPU indicates a failure, as shown at step 510. A count of errors is read from EEPROM memory 207 located on the receptacle 205. If the error count is sufficiently high or the average errors is at a high enough percentage, the user is notified that a problem may exist with the receptacle 205 and then given the opportunity to disable that site or replace the receptacle. If the device is inserted correctly, the CPU 200 proceeds to step 502 where a device identifier is read from the device 224. The device identifier provides device specific information, which can vary from particular devices of the same type and even from the same manufacturer, such as required programming voltages and programming pulse widths.

At step 504, the CPU 200 then adjusts its programming parameters, such as programming voltages, waveforms and pulse widths, based on the device identifier information. Once these parameters are fine tuned for the particular inserted device 224, at step 506, the CPU 200 performs the programming of the device 224 including other selected operations, such as blank checking, verification, security programming and checking and vector testing. At step 508, the CPU 200 determines whether these operations were performed successfully. If not so, the CPU 200 indicates a failure, as shown at step 510, and control returns to step 408 of FIG. 4. If the operations are successful, the results are indicated as passing, at step 512, and control returns to step 408 of FIG. 4. When a failure is detected at any step, the type of failure is communicated to the central controller 102 for display on the display 106.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. An apparatus for automated transfer of a sequence of operating codes into each memory of a plurality of programmable electronic devices, comprising:

a control computer;

a plurality of programming stations, each having its own computer connected into a network with said control computer;

each programming station further having a receptacle for receiving an electronic device to be programmed with the sequence of operating codes;

one of said programming stations serving as a master station during initial set up for a programming run of a group of electronic devices;

said control computer and the master station initially determining an optimal programming sequence for transfer of the sequence of operating codes into each memory of the group of programmable electronic devices;

said control computer thereafter broadcasting the determined optimal programming sequence over said network to said plurality of programming stations; and said plurality of programming stations transferring the sequence of operating codes into said electronic devices in said receptacles.

2. The apparatus of claim 1, further including:

each of said programming stations operating independently of the others to transfer the sequence of operating codes to a memory of an electronic device in said receptacle after receipt of the broadcast programming sequence from said control computer.

3. The apparatus of claim 2, wherein one of said programming stations develops a malfunction during a programming run and further including:

the others of said plurality of programming stations continuing to operate independently of said malfunctioning one during the programming run.

4. The apparatus of claim 1, wherein the programmable electronic devices carry a transmittable code indicative of operating parameters specific to the device, and wherein:

each of said programming stations includes means for activating the device to send the transmittable code; and wherein said master station includes means for receiving the transmittable code when sent and adjusting the determined programming sequence according to the operating parameters indicated by the received code from the device.

5. The apparatus of claim 1, wherein said programming stations include:

a status detector detecting the status of transfer of the sequence of operating codes into the device; and a status indicator indicating the detected status of the transfer of the sequence of operating codes into the device.

6. The apparatus of claim 1, wherein said status detector includes a detector detecting removal of a device from said receptacle after transfer of the sequence of operating codes to the device is completed.

7. The apparatus of claim 6, wherein said status indicator includes:

a removal indicator to indicate removal of the device from said receptacle after the sequence of operating codes transfer is completed.

8. A method of automated transfer of a sequence of operating codes into memories of a plurality of programmable electronic devices, comprising the steps of:

connecting a plurality of programming stations, each having its own computer and a receptacle for receiving a programmable electronic device to be programmed, into a network with a control computer;

initially determining an optimal programming sequence for a programming run of a group of programmable electronic devices with the control computer and with one of said programming stations serving as a master station;

thereafter broadcasting the determined optimal programming sequence over said network to said plurality of programming stations;

inserting programmable electronic device into the receptacles of the programming stations; and transferring the sequence of operating codes into the devices at the program stations according to the determined optimal programming sequence.

9. The method of claim 8, further including the step of:

each of said programming stations operating independently of the others to program devices after receipt of the broadcast programming sequence from said control computer.

10. The method of claim 8, wherein one of said programming stations develops a malfunction during a programming run and further including the step of the others of said plurality of programming stations continuing to operate independently of the malfunctioning one during the programming run.

11. The method of claim 8, wherein the programmable electronic devices carry a transmittable code indicative of operating parameters specific to the programmable electronic device, and further including the steps of:

activating the programmable electronic device of the programming station to send the transmittable code subsequent to its insertion into the receptacle of the programming station;

receiving the code at the master station when sent; and adjusting the determined programming sequence according to the operating parameters indicated by the received code from the device.

12. An apparatus for automated transfer of a sequence of operating codes into memories of a plurality of programmable electronic devices, comprising:

a plurality of programming sites connected to a control computer over a network, each programming site having its own controller for independently programming one of said plurality of programmable electronic devices, and further including a receptacle for receiving a programmable electronic device, said controller transferring the sequence of operating codes into said received programmable electronic device according to an optimal programming sequence determined by the control computer and one of the plurality of programming sites.

13. The apparatus of claim 12, wherein each said programming site is uniquely identifiable, the apparatus further including:

a central controller coupled to said plurality of programming sites, said central controller communicating a sequence of operating codes to each programming site.

14. The apparatus of claim 12, wherein one of said programming sites serves as a master site, the apparatus further including:

said master site performing said sequence of programming steps; and each of said plurality of programming sites receiving and retaining said programming steps.

15. The apparatus of claim 14, wherein said master site performs the functionality of said central controller.

16. The apparatus of claim 12, wherein each said controller at said plurality of programming sites includes memory for retaining said sequence of operating codes.

17. The apparatus of claim 12, wherein said plurality of programming sites include a shared memory for retaining said sequence of operating codes.

18. The apparatus of claim 12, wherein the programmable electronic devices carry a transmittable code indicative of operating parameters specific to the device, and wherein:

each of said programming sites includes means for activating the device to send the transmittable code; and wherein said controller includes means for receiving the transmittable code when sent and adjusting parameters of said sequence of programming steps according to the operating parameters indicated by the received code from the device.

19. The apparatus of claim 12, wherein performance of each programming site is independent of the other.

20. The apparatus of claim 12, wherein if one of said programming sites develops a malfunction the remaining of said plurality of programming sites continue to operate independently of said malfunctioning one.

21. A method of automated transfer of a sequence of operating codes into a memory of each of a plurality of programmable electronic devices, each programmable electronic device placed into one of a plurality of programming sites, each programming site for connecting to a central controller, one of said programming sites serving as a master site, the method comprising the steps of:

receiving data, a programming algorithm and programming parameters into said master site from said central controller;

inserting a programmable electronic device into said master site;

reading device information at the master site from said inserted programmable electronic device;

modifying said programming parameters based on said device information;

determining with the master site and the central controller, an optimal sequence of steps required to program said device, said optimal sequence of steps assembled according to said data, said programming algorithm, and said programming parameters:

retaining the optimal sequence of steps; and providing said optimal sequence of steps to each of said plurality of programming sites.

22. The method of claim 21, wherein said sequence of steps is assembled according to said data, said programming algorithm, and said programming parameters.

23. The method of claim 21, wherein said device information includes programming voltages, pulse widths and other programming parameters.

24. The method of claim 21, wherein said programming information is comprised of data, programming algorithms, and device programming parameters.

25. The method of claim 21, further comprising the step of:

selecting a device type to be programmed, said selection performed at the central controller before said receiving step.

26. An apparatus for automated transfer of an arrangement of gating logic instructions into a plurality of programmable logic arrays, comprising:

a control computer;

a plurality of programming stations, each having its own computer connected into a network with said control computer;

each programming station further having a receptacle for receiving an electronic device to be programmed with an arrangement of logic instructions;

one of said programming stations serving as a master station during initial set up for a programming run of a group of programmable logic arrays;

said control computer and the master station initially determining an optimal programming sequence for transfer of an arrangement of gating logic instructions into the group of programmable logic arrays;

said control computer thereafter broadcasting the determined optimal programming sequence over said network to said plurality of programming stations; and said plurality of programming stations transferring the arrangement of logic instructions into said plurality of programmable logic arrays in said receptacles.

27. The apparatus of claim 26, further including:

each of said programming stations operating independently of the others to transfer the arrangement of gating logic instructions to a programmable logic array in said receptacle after receipt of the broadcast programming sequence from said control computer.

28. The apparatus of claim 27, wherein one of said programming stations develops a malfunction during a programming run and further including:

the others of said plurality of programming stations continuing to operate independently of said malfunctioning one during the programming run.

29. The apparatus of claim 26, wherein the programmable logic arrays carry a transmittable code indicative of operating parameters specific to the array, and wherein:

each of said programming stations includes means for activating the array to send the transmittable code; and wherein said master station includes means for receiving the transmittable code when sent and adjusting the determined programming sequence according to the operating parameters indicated by the received code from the array.

30. The apparatus of claim 26, wherein said programming stations include:

a status detector detecting the status of transfer of the arrangement of gating logic instructions into the array; and a status indicator indicating the detected status of the transfer of the arrangement of gating logic instructions into the array.

31. The apparatus of claim 26, wherein said status detector includes a detector detecting removal of an array from said receptacle after transfer of the arrangement of gating logic instructions to the array is completed.

32. The apparatus of claim 31, wherein said status indicator includes:

a removal indicator to indicate removal of the array from said receptacle after the arrangement of gating instructions transfer is completed.

33. A method of automated transfer of an arrangement of gating logic instructions into a plurality of programmable logic arrays, comprising the steps of:

connecting a plurality of programming stations, each having its own computer and a receptacle for receiving a plurality of programmable logic arrays to be programmed, into a network with a control computer;

initially determining an optimal programming sequence for a programming run of a group of the programmable logic arrays with the control computer and with one of said programming stations serving as a master station;

thereafter broadcasting the determined optimal programming sequence over said network to said plurality of programming stations;

inserting programmable logic arrays into the receptacles of the programming stations; and transferring the arrangement of gating logic instructions into the arrays at the program stations according to the determined optimal programming sequence.

34. The method of claim 33, further including the step of:

each of said programming stations operating independently of the others to program arrays after receipt of the broadcast programming sequence from said control computer.

35. The method of claim 33, wherein one of said programming stations develops a malfunction during a programming run and further including the step of:

the others of said plurality of programming stations continuing to operate independently of the malfunctioning one during the programming run.

36. The method of claim 33, wherein the programmable logic array devices carry a transmittable code indicative of operating parameters specific to the programmable logic array, and further including the steps of:

activating the programmable logic array of the programming station to send the transmittable code subsequent to its insertion into the receptacle of the programming station;

receiving the code at the master station when sent; and adjusting the determined programming sequence according to the operating parameters indicated by the received code from the array.

37. An apparatus for automated transfer of an arrangement of gating logic instructions into a plurality of programmable logic arrays, comprising:

a plurality of programming sites connected to a control computer over a "network, one of said programming sites serving as a master site during initial set up for a programming run of a group of programmable logic arrays" each programming site having its own controller for independently programming one of said plurality of programmable logic arrays, and further including a receptacle for receiving a programmable logic array, said controller transferring the arrangement of gating logic instructions into said received programmable logic array according to an optimal programming sequence determined by the control computer and said master site.

38. The apparatus of claim 37, wherein each said programming site is uniquely identifiable, the apparatus further including:

a central controller coupled to said plurality of programming sites, said central controller communicating an arrangement of gating logic instructions to each programing site.

39. The apparatus of claim 37, wherein each said controller at said plurality of programming sites includes memory for retaining said programming sequence of an arrangement of gating logic instructions.

40. The apparatus of claim 37, wherein said master site performs the functionality of said central controller.

41. The apparatus of claim 37, wherein said plurality of programming sites include a shared memory for retaining said programming sequence of an arrangement of gating logic instructions.

42. The apparatus of claim 37, wherein the programmable logic arrays carry a transmittable code indicative of operating parameters specific to the array, and wherein;

each of said programming sites includes means for activating the array to send the transmittable code; and wherein said controller includes means for receiving the transmittable code when sent and adjusting parameters of said sequence of programming steps according to the operating parameters indicated by the received code from the array.

43. The apparatus of claim 37, wherein performance of each programming site is independent of the other.

44. The apparatus of claim 37, wherein if one of said programming sites develops a malfunction the remaining of said plurality of programming sites continue to operate independently of said malfunctioning one.

45. A method of automated transfer of an arrangement of gating logic instructions into a plurality of programmable logic arrays, each programmable logic array placed into one of a plurality of programming sites, each programming site for connecting to a central controller, one of said programming sites serving as a master site, the method comprising the steps of:

receiving data, a programming algorithm and programming parameters into said master site from said central controller;

inserting a programmable logic array into said master site;

reading device information at the master site from said inserted programmable logic array;

modifying said programming parameters based on said device information;

determining with the master site and the central controller, an optimal sequence of steps required to program said device, said optimal sequence of steps assembled according to said data, said programming algorithm, and said programming parameters;

retaining the optimal sequence of steps; and providing said optimal sequence of steps to each of said plurality of programming sites.

46. The method of claim 45, wherein said sequence of steps is assembled according to said data, said programming algorithm, and said programming parameters.

* * * * *